United States Patent [19]
Alford et al.

[11] Patent Number: 4,912,436
[45] Date of Patent: Mar. 27, 1990

[54] FOUR PORT DUAL POLARIZATION FREQUENCY DIPLEXER

[75] Inventors: James L. Alford; Robert E. Terry, both of Rancho Palos Verdes, Calif.

[73] Assignee: Gamma-F Corporation, Los Angeles, Calif.

[21] Appl. No.: 62,761

[22] Filed: Jun. 15, 1987

[51] Int. Cl.4 .................... H01P 1/161; H01P 1/213; H03H 7/46

[52] U.S. Cl. .................... 333/135; 333/21 A

[58] Field of Search .................... 333/126, 129, 134–137, 333/21 A

[56] References Cited

U.S. PATENT DOCUMENTS

| | | | |
|---|---|---|---|
| 4,047,128 | 9/1977 | Morz | 333/21 A X |
| 4,491,810 | 1/1985 | Saad | 333/126 |
| 4,498,062 | 2/1985 | Massiglia et al. | 333/135 |
| 4,546,471 | 10/1985 | Bui-Hai | 333/135 X |
| 4,700,154 | 10/1987 | Schuegraf | 333/126 X |

FOREIGN PATENT DOCUMENTS

| | | | |
|---|---|---|---|
| 28676 | 2/1980 | Japan | 333/137 |
| 2166297 | 4/1986 | United Kingdom | 333/21 A |

*Primary Examiner*—Eugene R. Laroche
*Assistant Examiner*—Benny Lee
*Attorney, Agent, or Firm*—Merchant, Gould, Smith, Edell, Welter & Schmidt

[57] ABSTRACT

A diplexer for communicating signals in two different frequency bands with separate polarizations in each band may, for example, concurrently separate low frequency received signals of orthogonal polarizations from high frequency transmitted signals, also of orthogonal polarizations. To this end a common square waveguide leads to serially disposed, axially displaced, orthogonal mode transitions at which branches are made to closely coupled lowpass filters that communicate with separate ports for low frequency signal bands. A smaller square waveguide coupled to the second of the orthogonal mode transitions communicates with another orthogonal mode transition at which axially displaced branches communicate with other ports for high frequency signal bands.

5 Claims, 2 Drawing Sheets

FOUR PORT DUAL POLARIZATION FREQUENCY DIPLEXER

BACKGROUND OF THE INVENTION

The need for transmitting and receiving microwave energy at different frequencies and with different polarizations is now often encountered in telecommunications systems, such as ground based antenna systems which communicate with a satellite. In a typical installation, a given frequency band is dedicated to a preselected number of frequency separated channels each having a carrier of designated frequency. For more effective use of the band, separate information carrying signals at each frequency are propagated with horizontal and vertical polarizations, enabling two programs to occupy the same part of the spectrum. Various techniques are known for separation of signals in accordance with polarization, including dual ports of orthogonal orientation, mechanically rotatable frequency selective elements and the like. However, it is desirable concurrently to transmit and receive in both frequency bands and both polarizations. It is also often desirable to use the same or a like arrangement to separate received signals of different polarizations in two frequency bands from a common port, or to combine transmissions from four different sources at a common port.

For the typical transmit and receive application, a broadcast band often uses 24 channels, with 12 different frequencies and both horizontally and vertically polarized signals at each frequency. Where it is desired both to transmit and receive concurrently, dynamic switching and circulating devices cannot be used and a diplexer must be employed. With four discrete information bands, however, the problems of achieving efficient signal separation in a passive manner are considerable. Where a diplexer can function with needed efficiency, however, it can couple an existing antenna system to transmit/receive electronics and provide capabilities for doubling or quadrupling the capacity o an existing system. However, to do so economically requires overcoming a number of interrelated problems.

When electromagnetic wave energy is transferred along a waveguide, the waveguide is usually configured so as to propagate energy stably in a preferred mode. Thus, the broad and narrow walls of a rectangular waveguide are so dimensioned as to propagate most efficiently at a given frequency. In this mode of propagation the electric field vector, in effect the wave polarization, is perpendicular to the broad walls, and the waveguide will not propagate the orthogonal polarization. A square waveguide can adequately, but somewhat less stably and efficiently, propagate two orthogonally polarized signals at the chosen wavelength. However, difficulties quickly arise if it is desired to propagate additional signals at a second wavelength, shorter than the first. Here the square waveguide does not act as a cutoff, as it might if the second wavelength were too long, but tends to introduce multi-mode operation, internal reflections and inherent losses. Nonetheless, a common port and waveguide section are needed for diplexers used in conjunction with a common antenna. In this combination the high power transmitted signals provided to the antenna feed cannot significantly interact with the much lower power level received signals. Likewise the signals of different polarization should be kept distinct, and spurious modes cannot be introduced.

Specifically, it is necessary to maintain a very low VSWR and a minimum interchannel isolation that is greater than 30 dB, while also having very low insertion loss and a high degree (in excess of 35 dB) polarization purity. Prior art systems have recognized the problems of internal signal reflections, and the creation of undesirable modes of propagation, and have accordingly adopted sophisticated expedients for achieving the needed levels of performance. These have usually ben based on the premise that symmetrical couplings and complex configurations are needed, with the result that the systems have been both cumbersome and expensive, and have often resulted in lower performance than is desired.

With existing systems, moreover, both price and performance present substantial problems and it is desirable to have a passive diplexer system that not only is lower in cost but improved in performance.

SUMMARY OF THE INVENTION

A diplexer in accordance with the invention has a common input port communicating with a square waveguide supporting propagation of four different information carrying bands, comprising two at a lower frequency having vertical and horizontal polarizations respectively, and a corresponding orthogonally polarized pair at a second frequency band. The signal paths to and from the common square waveguide include three serially disposed orthogonal mode transitions, a first pair for low frequency signals and a third for high frequency signals. Side coupled junctions are asymmetrically placed relative to these transitions to transfer vertical and horizontally polarized components of the signals. Signals in the lower frequency band are transferred between individual ports, for horizontal and vertical polarization respectively, to or from the common square waveguide via low pass filters. The higher frequency signals are fed into or taken from the system between two other separate ports coupled to the third orthogonal mode transition, also in an asymmetric manner. A second square waveguide couples the third orthogonal mode transition to the first pair of orthogonal mode transitions, and supports both modes of polarization at the higher frequency. High frequency transmitted wave energy from two ports is propagated through the transitions, being rejected at the lowpass filters. The placement of the junctions and the asymmetrical waveguides are so arranged that the electrical properties are equal or superior to those obtained with more complex prior art systems, For example if the signals are in the C-band with a higher frequency transmit range of 5.850–6.425 GHz and a lower frequency receive range of 3.625–4.200 GHz, the insertion loss is less than 0.2 dB, the VSWR is less than 1.2:1 and the isolation between the bands is 35 dB minimum.

In a particular example of a diplexer in accordance with the invention, the asymmetrical arrangement of arms and junctions is utilized together with special waveguide and filter constructions which can be fabricated in one piece by precision electroforming techniques to provide performance superior to that available in the prior art. A first square waveguide forming the common port at one end leads to a first transition section which is intercepted by a side junction incorporating a corrugated waveguide filter and a serially coupled capacitive filter comprising a reduced height ridge waveguide. These elements form a lowpass filter that leads to a port for vertically polarized low frequency waves to be received. Subsequent to the first transition section, a second junction leads to a second corrugated lowpass filter, to transfer horizontally polarized low frequency received energy to a separate port. Along the principal axis of the common waveguide, after the second low frequency junction, a second square waveguide is coupled to a third orthogonal mode transition. Into this transition another side junction is defined that leads to a rectangular waveguide which propagates high frequency vertically polarized transmit energy. An in-line rectangular waveguide propagates horizontally polarized waves at the same frequency into the transition as well. Consequently, four wave coupling paths are established with the common port for concurrent, noninterfering operation.

The diplexer may be compactly arranged by disposing the ports in a common plane through the use of 90° bends in three of the waveguide sections. With this arrangement, both polarizations of the low frequency transmit band are coupled into the common waveguide and port with a high degree of isolation from the high frequency ports, and received energy is distributed, in accordance with its appropriate polarization, to the proper port with minimal creation of multiple modes or cross-channel interference.

BRIEF DESCRIPTION OF THE DRAWINGS

A better understanding of the invention may be had by reference to the following description, taken in conjunction with the accompanying drawings, in which.

DETAILED DESCRIPTION OF THE INVENTION

Figure 1:
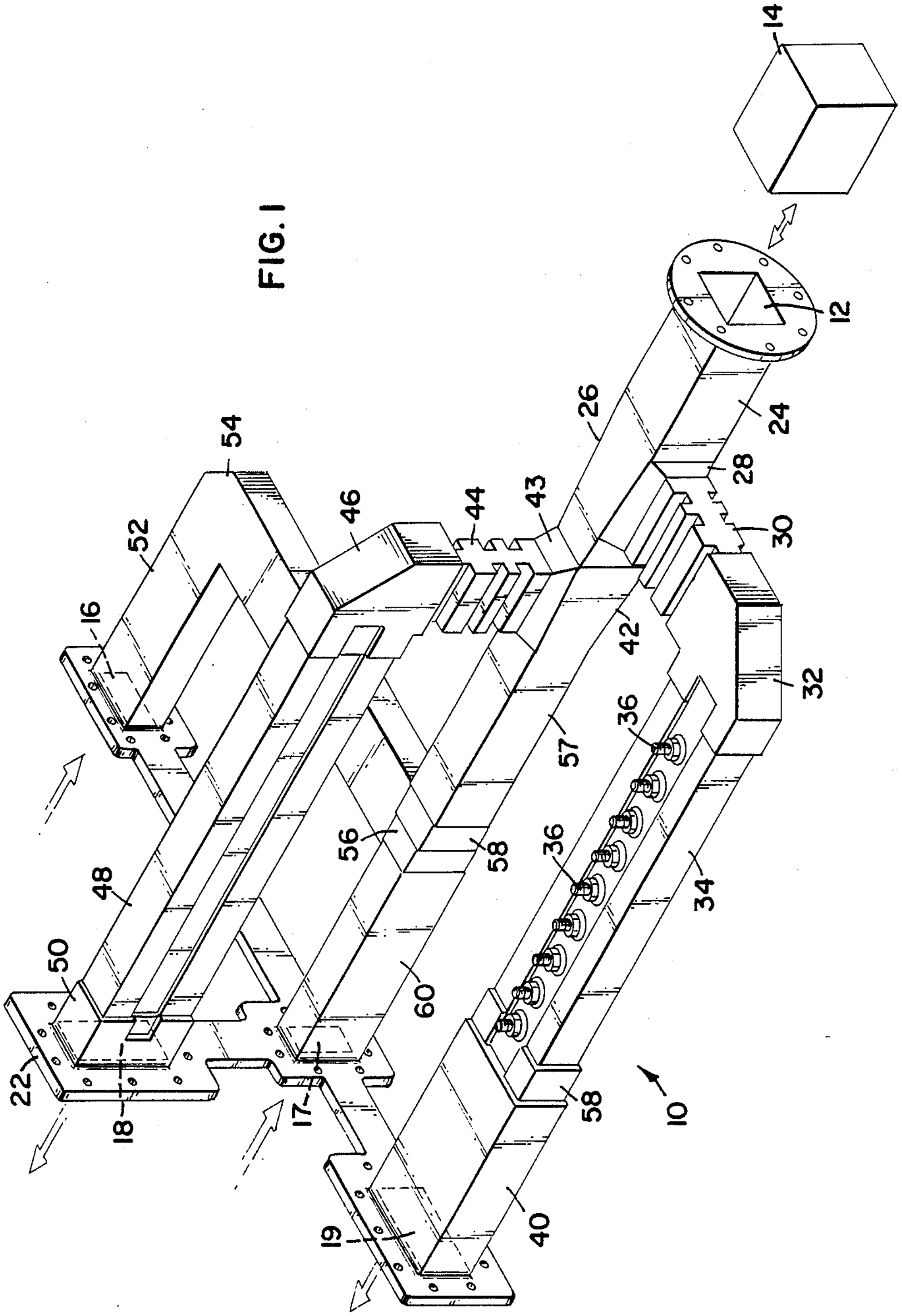
FIG. 1 is a perspective view of a diplexer in accordance with the invention.
Figure 3:
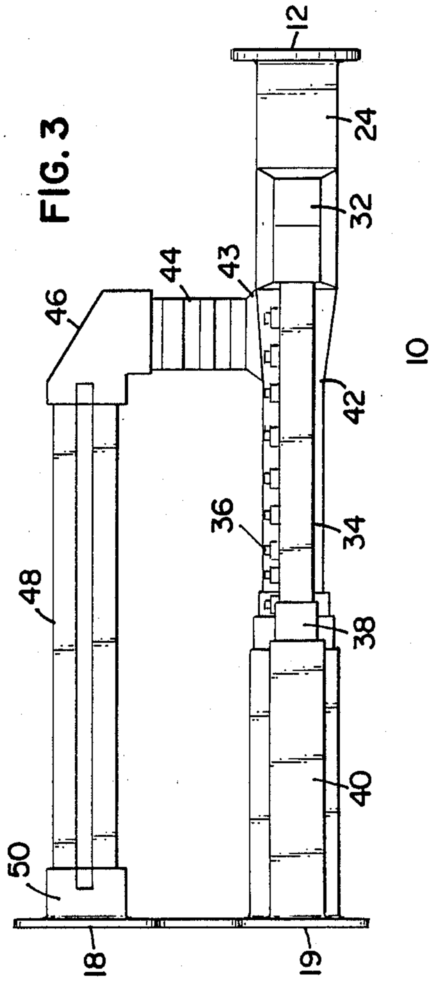
FIG. 3 is an end view of the arrangement of FIG. 1.
Figure 2:
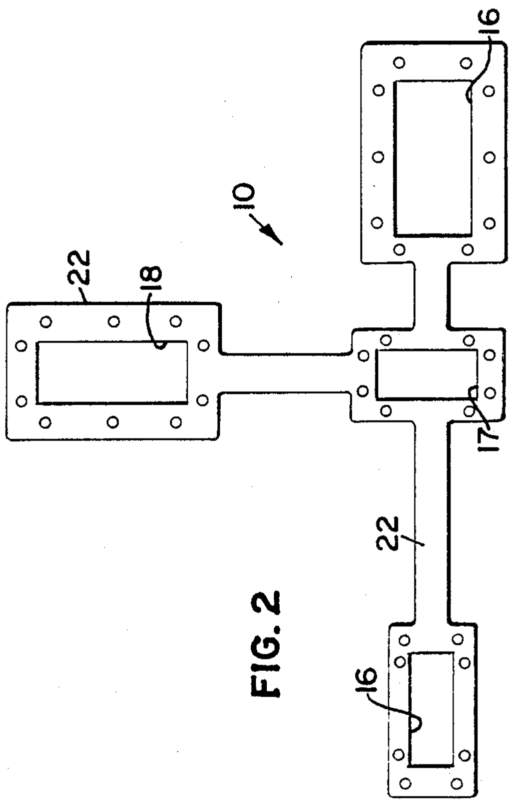
FIG. 2 is a side view of the diplexer of FIG. 1.

A dual frequency band diplexer 10 having a common port 12 is depicted in FIGS. 1–3 as used in a satellite system in which the common port 12 feeds signals to and receives signals from an antenna feed 14, shown only generally. THe antenna feed 14 is associated with an antenna system (not shown) while the diplexer 10 has four separate ports lying in a common plane, the first and second of these ports 16, 17 being for high frequency transmitted signals of vertical and horizontal polarity respectively. Third and four ports 18, 19 respectively are for low frequency received signals of horizontal and vertical polarity respectively. The transmit bands are in the range from 5.8 to 6.5 GHz, while the receive frequency band extends from 3.6 to 4.3 GHz in this example.

For compactness, and ease of coupling to the associated system, the four ports 16–19 are joined together in a common plane which they occupy by a flange 22 (see FIG. 2) to which external waveguides (not shown) are coupled, to extend from transmitters or to receivers (not shown) in the associated system. The system may also include pressure sealing windows that are transparent to microwave energy for providing barriers against leakage under differential pressures. It will be understood that the given frequency bands are merely examples, and also that the relative orientations that are given for horizontal and vertical polarization are arbitrary, inasmuch as the diplexer can function in any attitude.

A common square waveguide 24 is disposed along a linear reference axis and coupled to the common port 12. This square waveguide 24 is sized to support both horizontal and vertical propagation modes over a broad frequency band that covers both the transmit and receive frequency ranges. For the frequency bands given the square waveguide 24 is 1.79" on a side, which is an intermediate size for the two wavelengths used, and which propagates both polarization of both frequencies without either cut off or spurious mode introduction. For precision and ease of manufacture, it is preferred that the entire diplexer 10 be fabricated by electroforming, which enables interior surfaces to be precisely dimensioned, of highly conductive materials, and free of irregularities. Both high frequency and low frequency modes and both vertical and horizontal polarization modes are thus supported in this common square waveguide 24.

The common square waveguide 24, in the direction away from the common port 12, joins a first orthogonal mode transition 26 which reduces, in successive steps, the distance between the lateral sides (as viewed in FIGS. 1–3) of the square waveguide 24, leaving the top to bottom spacing the same. A first side wall junction 28 extends perpendicularly from the midregion of the first orthogonal mode transition 26, and is directly coupled to a first low pass filter 30 in the form of a corrugated waveguide section which supports the receive band vertical mode of polarization only. In a preferred arrangement, subsequent to the first lowpass waveguide filter 30, a 90° angle waveguide 32 turns the wave path so as to be parallel with the reference axis of the common square waveguide 24 and is coupled to one end of a second lowpass waveguide filter 34 in the form of a reduced height ridge waveguide section having adjustable tuning posts 36. The internal ridge extending along the underside of tee waveguide 34 is not visible in this part of FIG. 1, but can be seen in a different branch arm. A first step transition 38 of rectangular cross-section at the opposite end of the second lowpass ridge waveguide filter 34 couples to a rectangular waveguide section 40 for transferring the vertically polarized receive band signals directly to the fourth port 19. The cross-sectional dimensions of the waveguide section in this example are 2.29"×1.145".

The horizontally polarized receive band signals propagate through the first orthogonal mode transition 26 into a second transition section 42 which reduces in height (as seen in FIGS. 1 and 2) and to which is coupled a second side junction 3 forming a T with the top wall. The top wall of the second side junction 43 is coupled to a third lowpass filter 44 (in the form of a corrugated waveguide) which, via a second 90° angle section 46, communicates with a fourth lowpass waveguide filter 48 (another reduced height ridge waveguide). Thus this branch also rejects the high frequency transmit band without significant distortion of the field patterns at the side junction 43. A second step transition 50 from the fourth lowpass filter 48 provides the desired output coupling to the third port 18.

The high frequency transmit band signals are applied to the first port 16 and second port 17, these receiving the vertically polarized and horizontally polarized signals respectively. From the first port 16, vertically polarized signals are transmitted along a first high frequency waveguide section 52 that supports vertical polarization and is parallel to the longitudinal axis of the common square waveguide 24. The transmit energy is directed through a 90° corner section 54 to a side arm junction 56 leading into a third orthogonal mode transition 58 that is coupled in-line to he second orthogonal mode transition 42 via a second small square waveguide section 57 that supports only waves in the high frequency transmit band. Axially in line with the third orthogonal mode transition 58 and the second port 17, a second high frequency waveguide section 60 is oriented to propagate horizontally polarized waves in the transmit bad. The third orthogonal mode transition 58 cuts off any low frequency receive band signals while efficiently passing the horizontally and vertically polarized transmit band signals. The rectangular waveguides 52, 60 are 0.622"×1.372" in cross-section, while the second square waveguide 57 is 1.18" square so that the transition 58 must increase in the vertical direction while decreasing in the horizontal direction (as seenin FIGS. 1 and 2).

In operation, the system of FIGS. 1–3 functions to concurrently transfer four different signal bands in the appropriate directions between the ports 16–19 and the common port 12 leading to the antenna feed 14. The vertically polarized signal band that is to be transmitted is applied to the first port 16, from which it is propagated via the first high frequency waveguide section 52, the corner section 54 and the junction 56 into the third orthogonal mode junction 58. From this junction 58 it cannot be propagated in the second high frequency waveguide section 60 due to the orthogonal orientation of that element, and it transfers along the second square waveguide 42, past the second transition 42 and second junction 43, and through the first orthogonal mode transition 26 to the common square waveguide 24 and thence to the output at the common port 12. The vertically polarized high frequency transmit band is rejected at both the third lowpass filter 44 presented at the second junction 43, and the first lowpass filter 30 presented at the first side wall junction 28. Each of the successive square and rectangular waveguide sections propagates the vertically polarized transmit band without substantial spurious modes until the common port 12 is reached.

Wave energy of the horizontally polarized transmit band, also at high frequency, passes linearly from the second port 17 through the second high frequency waveguide section 60, the third orthogonal mode junction 58, smaller second square waveguide 57 and the two transitions 42 and 26 serially into the common square waveguide 24 and then the common port 12.

The spurious mode generation problem occurs only for the transmit band signals. Typically, side unctions 28, 43 would by virtue of their design cause generation of high levels of undesired higher order waveguide modes which for transmit band signals would propagate through waveguides 42 and 24 to the common port 12. The very close proximity of lowpass filters 30 and 44 in relation to the symmetrical transitions 42, 26 functions to hold spurious mode generation below levels that cause degradation of cross-polarized signal isolation.

Low power received frequency bands in the horizontal and vertically polarized modes taken through the common port 12 and the common square waveguide 24 are cut off at or before the second orthogonal mode junction 58 by the small square waveguide 57. The vertically polarize waves are split off at the first orthogonal mode transition 26 through the lowpass filter system and turned into a parallel path to the common waveguide axis so as to pass through the rectangular waveguide junction 40 to the fourth port 19. In like fashion, horizontally polarized waves are taken out of the common waveguide section 42 at the second junction 43, and passed through the subsequent lowpass filters 44, 48 to transfer through the second step transition 50 to the third port 18.

The entire diplexer 10 assembly is shown in FIGS. 1–3 between and including the ports may advantageously be fabricated as a single piece structure by electroforming techniques. Interior conducting surfaces are of copper with precise dimensions and definition of junctions, transitions, and filter sections.

Although a number of forms and variations in accordance with the invention have been described, it will be appreciated that the invention is not limited thereto but encompasses all modifications and variations within the scope of the appended claims.

What is claimed is:

1. A microwave diplexer for coupling a common port to first and second ports to transfer separately orthogonally polarized received signals in a first low frequency band, and coupling the common port to third and fourth ports to transfer separately orthogonally polarized signals to be transmitted in a second higher frequency band, comprising:

means comprising a common square waveguide means having a terminus defining the common port and defining a reference axis the common square waveguide means being dimensioned to propagate both polarizations of both frequency bands;

first orthogonal mode transition means coupled to the common square waveguide means at a spaced apart region from the common port and having an arm collinear with the reference axis;

first rectangular waveguide means coupled to the first orthogonal mode transition means and including a junction therewith, the first rectangular waveguide means being oriented to transfer energy in the first frequency band of a first polarization and including low pass filter means adjacent the junction with the orthogonal mode transition means;

second orthogonal mode transition means coupled to the arm of the first orthogonal mode transition that is collinear with the reference axis and including a junction therewith, the second orthogonal mode transition means being oriented and dimensioned to transfer energy in the first frequency band of a second polarization and further propagating energy of both polarizatons in the second frequency band;

second rectangular waveguide means coupled to the second orthogonal mode transition means and including a junction therewith in a wall orthogonal to and spaced apart from the first rectangular waveguide means, the second rectangular waveguide means being oriented to transfer energy in the first frequency band of the second polarization and including low pass filter means adjacent the junction with the second orthogonal mode transition means;

second square waveguide means coupled in-line to the second orthogonal mode transition means for transfer of both orthogonally polarized signals in a second higher frequency band;

third orthogonal mode transition means coupled to the second square waveguide means, the third orthogonal mode transition means propagating energy of both polarizations in the second higher frequency band;

third rectangular waveguide means coupled to a side wall of the third orthogonal mode transition means for propagating waves of a first polarization in the second frequency band;

fourth rectangular waveguide means coupled to the third orthogonal mode transition means collinear with the reference axis for propagating waves of the second polarization in the second frequency band;

port means coupled to each of the first, second, third and fourth rectangular waveguide means; and the first, second, and third waveguide means each include an angled corner section and a section in parallel with the reference axis, said sections being serially coupled between the associated low pass filter and the respective port means for the first and second waveguide means, and wherein each of the port means lie in a common plane normal to the reference axis.

2. The invention as set forth in claim 1 above, wherein the first and second rectangular waveguide means are orthogonally disposed relative to each other and displaced along the reference axis in the region of the orthogonal mode transition means.

3. A microwave diplexer for coupling a common port to first and second ports to transfer separately orthogonally polarized received signals in a first low frequency band, and coupling the common port to third and fourth ports to transfer separately orthogonally polarized signals to be transmitted in a second higher frequency band, comprising:

means comprising a common square waveguide means having a terminus defining the common port and defining a reference axis the common square waveguide means being dimensioned to propagate both polarizations of both frequency bands;

first orthogonal mode transition means coupled to the common square waveguide means at a spaced apart region from the common port and having an arm collinear with the reference axis;

first rectangular waveguide means coupled to the first orthogonal mode transition means and including a junction therewith, the first rectangular waveguide means being oriented to transfer energy in the first frequency band of a first polarization and including low pass filter means adjacent the junction with the orthogonal mode transition means;

second orthogonal mode transition means coupled to the arm of the first orthogonal mode transition that is collinear with the reference axis and including a junction therewith, the second orthogonal mode transition means being oriented and dimensioned to transfer energy in the first frequency band of a second polarization and further propagating energy of both polarizations in the second frequency band;

second rectangular waveguide means coupled to the second orthogonal mode transition means and including a junction therewith in a wall orthogonal to and spaced apart from the first rectangular waveguide means, the second rectangular waveguide means being oriented to transfer energy in the first frequency band of the second polarization and including low pass filter means adjacent the junction with the second orthogonal mode transition means;

second square waveguide means coupled in-line to the second orthogonal mode transition means for transfer of both orthogonally polarized signals in a second higher frequency band;

third orthogonal mode transition means coupled to the second square waveguide means, the third orthogonal mode transition means propagating energy of both polarizations in the second higher frequency band;

third rectangular waveguide means coupled to a side wall of the third orthogonal mode transition means for propagating waves of a first polarization in the second frequency band;

fourth rectangular waveguide means coupled to the third orthogonal mode transition means collinear with the reference axis for propagating waves of the second polarization in the second frequency band;

port means coupled to each of the first, second, third and fourth rectangular waveguide means; and the low pass filter means each comprise a serial arrangement of corrugated waveguide filter and reduced height ridge waveguide.

4. A microwave diplexer for coupling a common port to first and second ports to transfer separately orthogonally polarized received signals in a first low frequency band, and coupling the common port to third and fourth ports to transfer separately orthogonally polarized signals to be transmitted in a second higher frequency band, comprising:

means comprising a common square waveguide means having a terminus defining the common port and defining a reference axis the common square waveguide means being dimensioned to propagate both polarizations of both frequency bands;

first orthogonal mode transition means coupled to the common square waveguide means at a spaced apart region from the common port and having an arm collinear with the reference axis;

first rectangular waveguide means coupled to the first orthogonal mode transition means and including a junction therewith, the first rectangular waveguide means being oriented to transfer energy in the first frequency band of a first polarization and including low pass filter means adjacent the junction with the orthogonal mode transition means;

second orthogonal mode transition means coupled to the arm of the first orthogonal mode transition that is collinear with the reference axis and including a junction therewith, the second orthogonal mode transition means being oriented and dimensioned to transfer energy in the first frequency band of a second polarization and further propagating energy of both polarizations in the second frequency band;

second rectangular waveguide means coupled to the second orthogonal mode transition means and including a junction therewith in a wall orthogonal to and spaced apart from the first rectangular waveguide means, the second rectangular waveguide means being oriented to transfer energy in the first frequency band of the second polarization and including low pass filter means adjacent the junction with the second orthogonal mode transition means;

second square waveguide means coupled in-line to the second orthogonal mode transition means for transfer of both orthogonally polarized signals in a second higher frequency band;

third orthogonal mode transition means coupled to the second square waveguide means, the third orthogonal mode transition means propagating energy of both polarizations in the second higher frequency band;

third rectangular waveguide means coupled to a side wall of the third orthogonal mode transition means for propagating waves of a first polarization in the second frequency band;

fourth rectangular waveguide means coupled to the third orthogonal mode transition means collinear with the reference axis for propagating waves of the second polarization in the second frequency band;

port means coupled to each of the first, second, third and fourth rectangular waveguide means; and the orthogonal mode transitions are each step transitions narrowing the spacing between one opposed pair of walls of associated waveguide means.

5. The invention as set forth in claim 4 above, wherein the first rectangular waveguide means propagates vertically polarized signals and the first orthogonal mode transition means reduces the dimension between horizontally separated walls, wherein the second rectangular waveguide means propagates horizontally polarized signals and the second orthogonal mode transitions means reduces the dimension between vertically separated walls, wherein the third rectangular waveguide means propagates vertically polarized signals and the third orthogonal mode transition means reduces the dimension between horizontally separated walls.

* * * * *